(12) United States Patent
Burket et al.

(10) Patent No.: US 9,656,909 B2
(45) Date of Patent: *May 23, 2017

(54) METHODS FOR FORMING VIAS IN GLASS SUBSTRATES

(71) Applicant: CORNING INCORPORATED, Corning, NY (US)

(72) Inventors: Robert Carl Burket, Elkland, PA (US); Uta-Barbara Goers, Campbell, NY (US); Samuel Odei Owusu, Horseheads, NY (US); Tammy Lynn Petriwsky, Elmira, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/972,284

(22) Filed: Dec. 17, 2015

(65) Prior Publication Data

US 2016/0107925 A1   Apr. 21, 2016

Related U.S. Application Data

(63) Continuation of application No. 14/464,851, filed on Aug. 21, 2014, now Pat. No. 9,296,646.

(Continued)

(51) Int. Cl.
*C03C 15/00* (2006.01)
*H05K 1/03* (2006.01)
(Continued)

(52) U.S. Cl.
CPC .......... *C03C 15/00* (2013.01); *B23K 26/006* (2013.01); *B23K 26/302* (2015.10);
(Continued)

(58) Field of Classification Search
None
See application file for complete search history.

(56) References Cited

U.S. PATENT DOCUMENTS

| 6,224,713 B1 | 5/2001 | Hembree et al. |
| 6,563,079 B1 | 5/2003 | Umetsu et al. |
| (Continued) | | |

FOREIGN PATENT DOCUMENTS

| CN | 1200793 C | 5/2005 |
| CN | 1761378 A | 4/2006 |
| CN | 101722367 A | 6/2010 |
| WO | 2006112822 A1 | 10/2006 |
| WO | 2012075072 | 6/2012 |
| WO | 2012166753 | 12/2012 |

OTHER PUBLICATIONS

Patent Cooperation Treaty International Notification of Transmittal of the International Search Report and the Written Opinion of the International Searching Authority, international application No. PCT/US2014/053066: mailing date Dec. 5, 2014, 14 pages.

(Continued)

*Primary Examiner* — Jiong-Ping Lu
(74) *Attorney, Agent, or Firm* — John T. Haran

(57) ABSTRACT

Methods for forming vias in glass substrates by laser drilling and acid etching are disclosed. In one embodiment, a method forming a via in a glass substrate includes laser drilling the via through at least a portion of a thickness of the glass substrate from an incident surface of the glass substrate. The method further includes etching the glass substrate for an etching duration to increase a diameter of an incident opening of the via and applying ultrasonic energy to the glass substrate during at least a portion of the etching duration. The applied ultrasonic energy has a frequency between 40 kHz and 192 kHz.

10 Claims, 5 Drawing Sheets

Related U.S. Application Data

(60) Provisional application No. 61/871,440, filed on Aug. 29, 2013.

(51) Int. Cl.
*H05K 3/00* (2006.01)
*B23K 26/00* (2014.01)
*C03C 23/00* (2006.01)
*B23K 26/384* (2014.01)
*B23K 26/362* (2014.01)
*B23K 26/302* (2014.01)
*B23K 26/364* (2014.01)
*C03B 33/02* (2006.01)

(52) U.S. Cl.
CPC .......... *B23K 26/362* (2013.01); *B23K 26/364* (2015.10); *B23K 26/384* (2015.10); *C03C 23/00* (2013.01); *C03C 23/0025* (2013.01); *H05K 1/0306* (2013.01); *H05K 3/002* (2013.01); *H05K 3/0017* (2013.01); *H05K 3/0029* (2013.01); *C03B 33/0222* (2013.01); *C03C 2218/34* (2013.01); *H05K 2203/0285* (2013.01)

(56) References Cited

U.S. PATENT DOCUMENTS

| | | |
|---|---|---|
| 7,084,073 B2 | 8/2006 | Lee et al. |
| 2004/0092105 A1 | 5/2004 | Lee et al. |
| 2004/0217455 A1 | 11/2004 | Shiono et al. |
| 2009/0013724 A1* | 1/2009 | Koyo ................ B23K 26/0093 65/31 |
| 2011/0229687 A1 | 9/2011 | Gu et al. |
| 2011/0248405 A1 | 10/2011 | Li et al. |
| 2011/0259373 A1* | 10/2011 | Hotta .................. H05K 3/0055 134/27 |
| 2012/0048604 A1 | 3/2012 | Cornejo et al. |
| 2012/0235969 A1 | 9/2012 | Burns et al. |
| 2013/0050226 A1 | 2/2013 | Shenoy et al. |
| 2013/0089701 A1* | 4/2013 | Hooper ................. B23K 26/00 428/131 |

OTHER PUBLICATIONS

English Translation of CN201480059976.4 First Office Action Dated Feb. 4, 2017, China Patent Office.

* cited by examiner

METHODS FOR FORMING VIAS IN GLASS SUBSTRATES

CROSS-REFERENCE TO RELATED APPLICATIONS

This application is a continuation of U.S. patent application Ser. No. 14/464,851 filed on Aug. 21, 2014, now U.S. Pat. No. 9,296,646, which claims the benefit of priority of U.S. Provisional Application Ser. No. 61/871,440 filed on Aug. 29, 2013, the content of each is relied upon and incorporated herein by reference in its entirety.

BACKGROUND

Field

The present specification generally relates to methods for forming vias in glass substrates and, more specifically, to methods for forming vias in glass substrates by laser drilling and acid etching.

Technical Background

An interposer may be used as an electrical interface in an electronic device to spread an electrical connection to a wider pitch or to reroute a connection to a different connection. Typically, many thousands of vias (i.e., holes) are formed in the substrate of the interposer, which are subsequently filled with electrically conductive material and further processed in order to interface electrical connections. Interposers may be formed from a variety of materials, such as from silicon, fiber reinforced polymer ("FRP"), and glass.

FRP interposers may suffer from a variety of drawbacks. For example, cylindrical vias may be formed in FRP interposers by drilling with undesirably expensive fine drill bits. Such drill bits may wander on the surface of the substrate, thereby limiting hole diameter and pitch. Furthermore, the coefficient of thermal expansion ("CTE") of FRP interposers may be about five times greater than that of silicon, resulting in an undesirable thermal mismatch between silicon chips and FRP interposers. Moreover, FRP interposers tend to warp during processing, leading to difficulties with adhesion and bonding.

Glass interposers offer an attractive alternative to FRP interposers for a variety of reasons, such as the similarity of the CTE of glass to the CTE of silicon and the low cost of glass, among others. However, it may be difficult to form vias in glass interposers using conventional methods, such as drilling, which is not a practical technique for manufacturing glass interposers with vias.

Accordingly, a need exists for methods for forming vias in glass substrates.

SUMMARY

In one embodiment, a method of forming a via in a glass substrate includes laser drilling the via through at least a portion of a thickness of the glass substrate from an incident surface of the glass substrate. The method further includes etching the glass substrate for an etching duration to increase a diameter of an incident opening of the via and applying ultrasonic energy to the glass substrate during at least a portion of the etching duration. The applied ultrasonic energy has a frequency between 40 kHz and 192 kHz.

In another embodiment, a method of forming a through via in a glass substrate includes laser drilling the through via through a thickness of the glass substrate from an incident surface to an exit surface of the glass substrate, such that the through via extends between an incident opening of the incident surface of the glass substrate and an exit opening of the exit surface of the glass substrate. The method further includes applying an acid-resistant film to the incident surface of the glass substrate, such that the acid-resistant film covers the incident opening of the through via. The method further includes etching the glass substrate for a first etching duration to increase a diameter of the exit opening of the through via, removing the acid-resistant film from the incident opening of the through via, and etching the glass substrate for a second etching duration to increase the diameter of the incident opening and the exit opening of the through via.

In yet another embodiment, a method of forming a through via in a glass substrate includes laser drilling the through via through a thickness of the glass substrate from an incident surface to an exit surface of the glass substrate, such that the through via extends between an incident opening of the incident surface of the glass substrate and an exit opening of the exit surface of the glass substrate. The method further includes applying an acid-resistant film to the incident surface of the glass substrate to cover the incident opening of the through via, etching the glass substrate for a first etching duration to increase a diameter of the exit opening of the through via, applying ultrasonic energy to the glass substrate during at least a portion of the first etching duration, removing the acid-resistant film from the incident opening of the through via, etching the glass substrate for a second etching duration to increase the diameter of the incident opening and the exit opening of the through via, and applying ultrasonic energy to the glass substrate during at least a portion of the second etching duration. The ultrasonic energy applied during the second etching duration has a first frequency and a second frequency.

DETAILED DESCRIPTION

Figure 1:
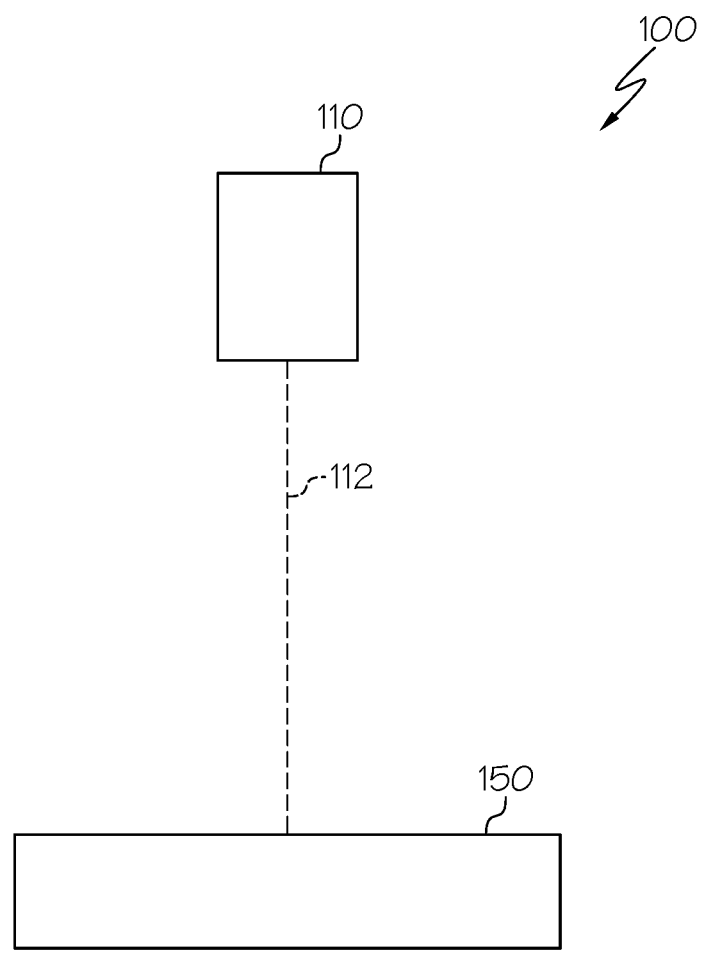
FIG. 1 schematically depicts an exemplary laser drilling system for laser drilling a glass substrate, according to one or more embodiments shown and described herein.

Reference will now be made in detail to various embodiments for laser drilling and etching glass substrates to form vias in the glass substrates, examples of which are illustrated in the accompanying drawings. Whenever possible, the same reference numerals will be used throughout the drawings to refer to the same or like parts.

As described herein, methods for forming a via in a glass substrate generally comprise laser drilling the via through at least a portion of a thickness of the glass substrate, etching the glass substrate for an etching duration to increase a diameter of an incident opening of the via, and applying ultrasonic energy to the glass substrate during at least a portion of the etching duration. In some embodiments, the applied ultrasonic energy may have a frequency between 40 kHz and 192 kHz. By applying ultrasonic energy having a frequency of between 40 kHz and 192 kHz during etching, glass substrates with vias having desired dimensions and properties can be quickly produced while minimizing damage to the glass.

Also described herein are methods for forming through vias in glass substrates that generally comprise laser drilling the through via through a thickness of the glass substrate, applying an acid-resistant film to an incident surface of the glass substrate to cover an incident opening of the through via, etching the glass substrate for a first etching duration, removing the acid-resistant film from the incident opening of the through via, and etching the glass substrate for a second etching duration. By forming through vias with such a method, the vias may have comparable incident opening and exit opening dimensions, thereby avoiding processing problems, costs, and delays associated with mismatched incident opening and exit opening dimensions.

As used herein, the term "through via" means a hole in a glass substrate that extends entirely through an entire thickness of the glass substrate. As used herein, the term "blind via" means an opening in a glass substrate that extends from a surface of the glass substrate through a portion of a thickness of the glass substrate to a depth, but that does not extend all the way through the thickness of the glass substrate.

Referring now to FIG. 1, an exemplary system for laser drilling a glass substrate is schematically depicted. The system 100 generally includes a laser source 110 for laser drilling the glass substrate 150. The laser source 110 may be any type of laser capable of drilling through the thickness of the glass substrate 150. The laser may drill through the glass substrate 150 using any laser drilling technique, such as but not limited to, laser ablation, trepanning, percussion drilling, and the like. In some embodiments, the laser source 110 is a solid state ultraviolet laser (such as a Nd:YAG laser) emitting a pulsed laser beam 112 having a wavelength of 355 nm. However, it should be understood that in other embodiments laser sources with other wavelengths may be used to laser drill the glass substrate 150.

In some embodiments, the laser source 110 may emit a laser beam 112 in order to laser drill a pilot hole for a through via or a blind via, as described herein. A pilot hole for a through via extends all the way through a thickness of the glass substrate 150. A pilot hole for a blind via extends from a surface of the glass substrate through a portion of a thickness of the glass substrate to a depth, but that does not extend all the way through the thickness of the glass substrate. The glass substrate 150 may be positioned on a translating table (not shown) such that it may be translated in two (or three) dimensions to drill multiple pilot holes in the glass substrate 150. Additionally or alternatively, the laser source 110 may be coupled to a translation mechanism such that a laser beam 112 produced by the laser source 110 may be translated with respect to the glass substrate 150 to drill multiple pilot holes in the glass substrate 150.

The glass substrate 150 may be formed from various glass compositions including, without limitation, borosilicate glasses, aluminosilicate glasses, aluminoborosilicate, and soda lime glasses. Further, the glass substrate 150 may be strengthened (e.g., by an ion exchange process) or non-strengthened. Exemplary glass substrates may include, but are not limited to, Corning EAGLE XG® glass, and chemically strengthened or non-strengthened Corning Gorilla® glass.

Figure 2:
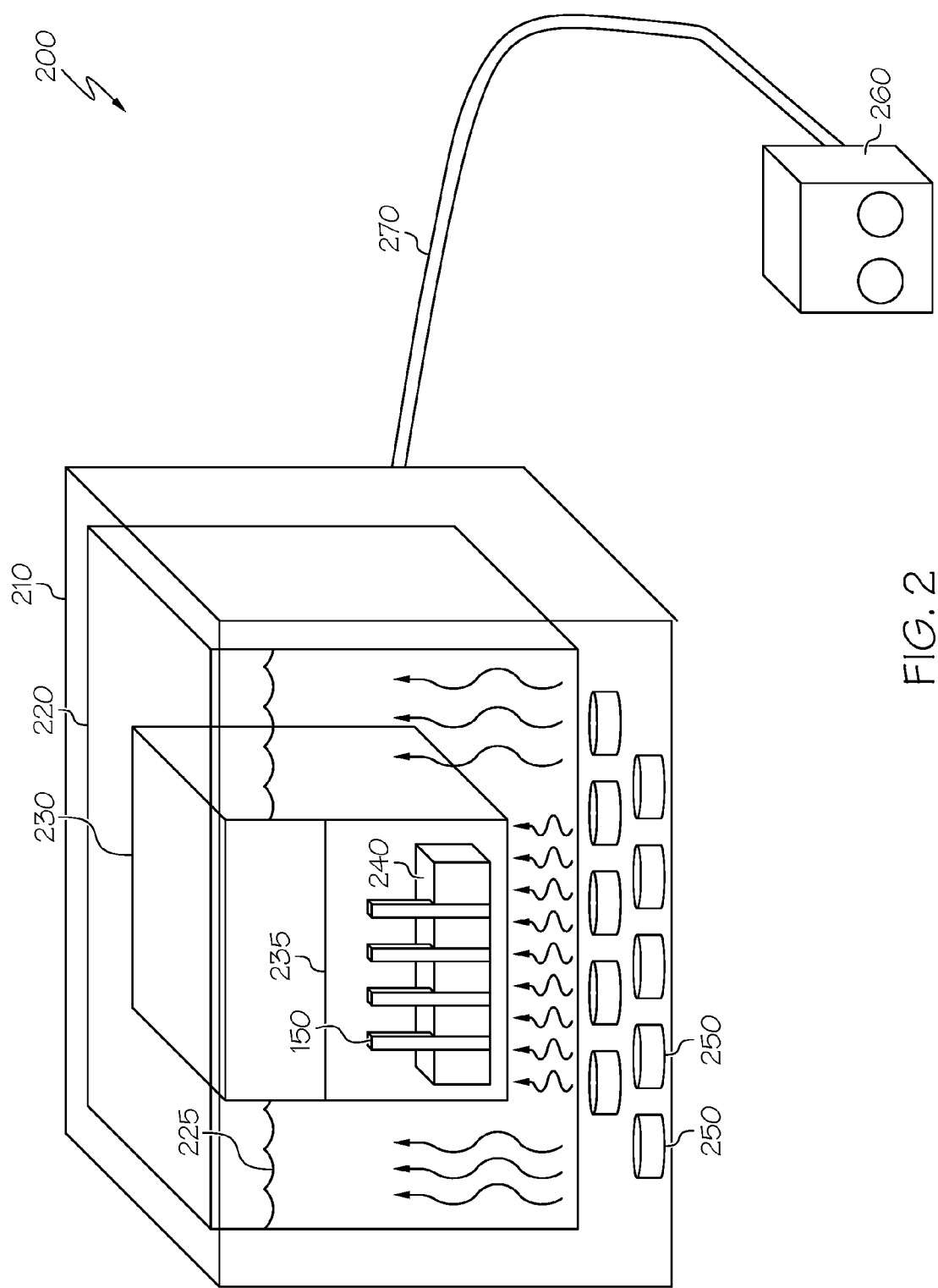
FIG. 2 schematically depicts a glass substrate etching apparatus, according to one or more embodiments shown and described herein.

Referring now to FIG. 2, an example etching apparatus 200 for etching the glass substrate 150 to open the laser drilled pilot holes is schematically depicted. Generally, the example etching apparatus 200 includes an outer container 210, a water tank 220, an etching solution tank 230, a sample holder 240, ultrasonic transducers 250, and an ultrasonic generator 260. In the illustrated embodiment, the etching solution tank 230 is disposed within the water tank 220 and the water tank 220 is disposed within the outer container 210. The ultrasonic transducers 250 may be disposed within the outer container 210 and interface with the water tank 220, such that ultrasonic energy may be imparted to water 225 contained within the water tank 220, which is then imparted to the etching solution 235 contained within the etching solution tank 230, and ultimately imparted to the glass substrate 150 supported by the sample holder 240 in the etching solution tank 230. It should be understood that the ultrasonic transducers 250 may be configured in any position and orientation relative to the water tank 220, such as below the water tank 220 and/or on the side of the water tank 220. The ultrasonic energy applied to the glass substrate 150 while being etched by the etching solution 235 in the etching solution tank 230 enhances the etching of the glass substrate 150 and facilitates the formation of vias with desirable characteristics, as will be described in further detail below.

In the embodiment depicted in FIG. 2, the sample holder 240 is fabricated such that the glass substrate 150 is supported in a vertical orientation. Not wishing to be bound by theory, when the sample holder 240 supports the glass substrate 150 in a vertical orientation, several glass substrates may be processed simultaneously and the ingression and egression of the etchant through the vias may be facilitated by the sinusoidal nature of the ultrasonic sound waves as they traverse the surface of the substrates while simultaneously enabling acoustic cavitation. In other embodiments, the sample holder 240 may be fabricated such that the glass substrate 150 is supported in a horizontal orientation in which the ultrasonic sound waves may travel directly or longitudinally through the vias. Not wishing to be bound by theory, when the glass substrate 150 is supported in a horizontal orientation, the ingression and egression of the etchant through the vias may be accomplished by both gravity and the traversal of the acoustic waves longitudinally through the vias. When the glass substrate 150 is supported in the horizontal orientation, it may be advantageous to process one glass substrate 150 at a time to avoid acoustic attenuation that may result from ultrasonic sound waves traveling from substrate to substrate.

The water tank 220 includes water 225 filled to a level sufficient to ensure that ultrasonic energy produced by the ultrasonic transducers 250 is transferred to the glass substrate 150 immersed within the etching solution tank 230. In some embodiments, water 225 is deionized water, which may include a few millimeters of detergent to reduce surface tension. However, it should be understood that in other embodiments water 225 may be a type of water other than deionized water and/or may not include detergent. Furthermore, it should be understood that a liquid other than water may be utilized to transfer the ultrasonic energy from the ultrasonic transducers 250 to the etching solution 235 within the etching solution tank 230. Some embodiments may not include the water tank 220, such as in embodiments in which the ultrasonic transducers directly agitate the etching solution 235 in the etching solution tank 230.

The etching solution tank 230 may be formed from an acid-resistant material, such as a plastic like polypropylene or high density polyethylene. The etching solution tank 230 includes the etching solution 235 filled to a level sufficient to ensure that ultrasonic energy produced by the ultrasonic transducers 250 is transferred to the glass substrate 150. In some embodiments, the etching solution 235 is an aqueous solution including deionized water, a primary acid, and a secondary acid. The primary acid may be hydrofluoric acid and the secondary acid may be nitric acid, hydrochloric acid, or sulfuric acid. In some embodiments, the etching solution 235 may include a primary acid other than hydrofluoric acid and/or a secondary acid other than nitric acid, hydrochloric acid, or sulfuric acid. Furthermore, in some embodiments, the etching solution 235 may only include a primary acid. In some embodiments, the etching solution 235 may include 20% by volume of a primary acid (e.g., hydrofluoric acid), 10% by volume of a secondary acid (e.g., nitric acid), and 70% by volume of deionized water. In other embodiments, the etching solution 235 may include different proportions of the primary acid, the secondary acid, and deionized water. In some embodiments, the etching solution 235 may include a surfactant, such as 5-10 mL of a commercially available surfactant.

The ultrasonic generator 260 is electrically connected to the ultrasonic transducers 250 via an electrical cable 270. The ultrasonic generator 260 causes the ultrasonic transducers 250 to produce ultrasonic energy at one or more frequencies. The ultrasonic transducers 250 may produce ultrasonic energy at a variety of frequencies. In some embodiments, the ultrasonic energy has a frequency between 40 kHz and 192 kHz. In some embodiments, the ultrasonic energy has a frequency between 80 kHz and 132 kHz. In some embodiments, the ultrasonic energy is centered about a primary frequency and dithered or swept above and below the primary frequency, such as when ultrasonic energy is centered about 80 kHz and swept back and forth between 79 kHz and 81 kHz (i.e., 80 kHz +/−1 kHz). In other embodiments, the ultrasonic energy may be centered about a different frequency and/or dithered or swept in a range greater than 1 kHz above and below the primary frequency. In some embodiments, the ultrasonic energy has a first frequency and a second frequency, such as when the ultrasonic transducers 250 produce ultrasonic energy having at least two frequencies. For example, a first ultrasonic transducer may produce ultrasonic energy having a first frequency and a second ultrasonic transducer may simultaneously produce ultrasonic energy having a second frequency. In some embodiments, the ultrasonic transducers 250 may produce the ultrasonic energy in a "40 kHz/80 kHz cross-fired" configuration in which the first frequency is 40 kHz and the second frequency is 80 kHz. In some embodiments, the ultrasonic transducers 250 may produce the ultrasonic energy in a "80 kHz/120 kHz cross-fired" configuration in which the first frequency is 80 kHz and the second frequency is 120 kHz. It should be understood that embodiments in which the ultrasonic energy is dithered or swept about a primary frequency or has a first frequency and a second frequency (e.g., in a "cross-fired" configuration), may avoid undesirable ultrasonic "hot spots" (areas in which glass damage or etching may occur faster than in other areas) in the glass substrate 150 that might arise if a single frequency were utilized.

Figure 3A:
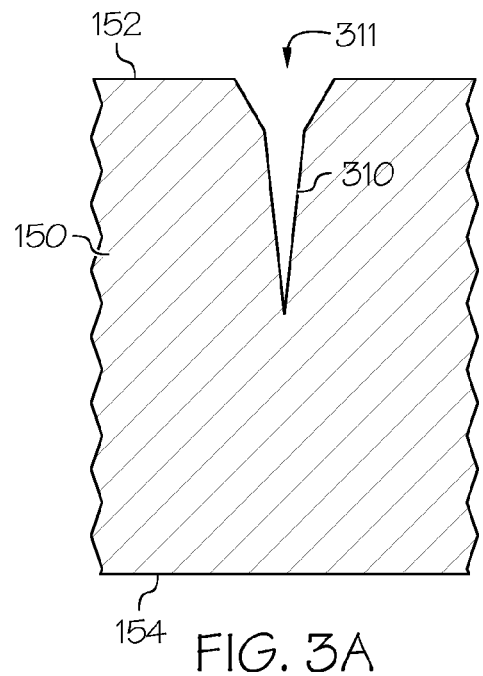
FIG. 3A schematically depicts a cross section of a glass substrate with a blind via pilot hole, according to one or more embodiments shown and described herein.
Figure 3B:
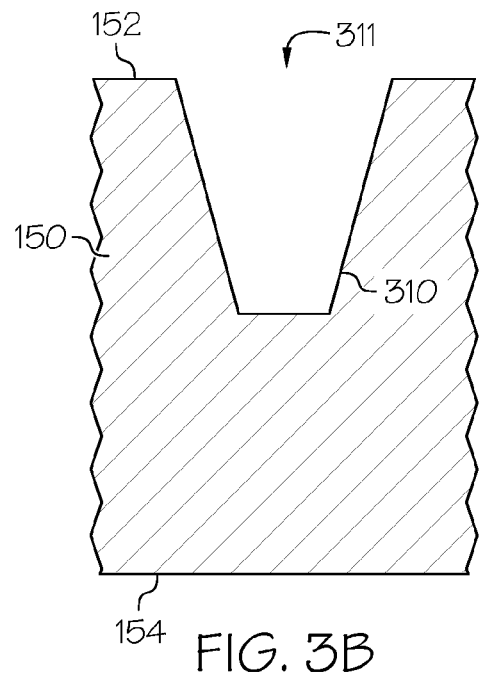
FIG. 3B schematically depicts a cross section of the glass substrate of FIG. 3A after being etched, according to one or more embodiments shown and described herein.

A method for forming a blind via in a glass substrate by laser drilling and then ultrasonic-enhanced etching will now be described with reference to FIGS. 3A-3B. Referring now to FIG. 3A, a pilot hole for the blind via 310 is laser drilled through a portion of the thickness of the glass substrate 150. In some embodiment, the pilot hole may be drilled using the system 100 depicted in FIG. 1. The pilot hole for the blind via 310 is laser drilled from an incident surface 152 of the glass substrate 150 to a depth of the glass substrate 150. The pilot hole extends through the glass substrate 150 from an incident opening 311 of the incident surface 152 into the glass substrate 150. The pilot hole for the blind via 310 does not extend all the way through the thickness of the glass substrate 150.

Once the pilot hole for the blind via 310 is drilled, the glass substrate 150 is submerged in the etching solution 235 of the etching solution tank 230, as depicted in FIG. 2. Ultrasonic energy is applied by the ultrasonic transducers 250 while the glass substrate 150 is being etched. The glass substrate 150 is etched with the etching solution for an etching duration to increase a diameter of the incident opening 311 of the blind via 310 and the diameter along the entire depth of the blind via 310, as depicted in FIG. 3B. In some embodiments, the glass substrate 150 is also mechanically agitated, such as by moving the glass substrate 150 up and down or side to side in the etching solution 235 either manually or by machine, during at least a portion of the etching duration to facilitate removal of sludge from the via.

Figure 4A:
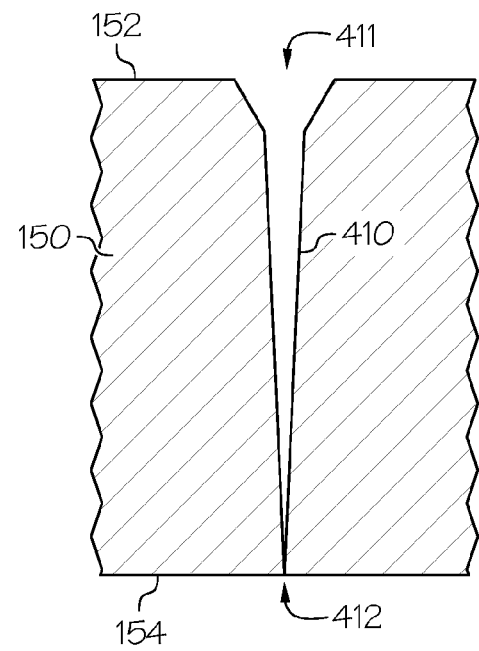
FIG. 4A schematically depicts a cross section of a glass substrate with a through via pilot hole, according to one or more embodiments shown and described herein.
Figure 4B:
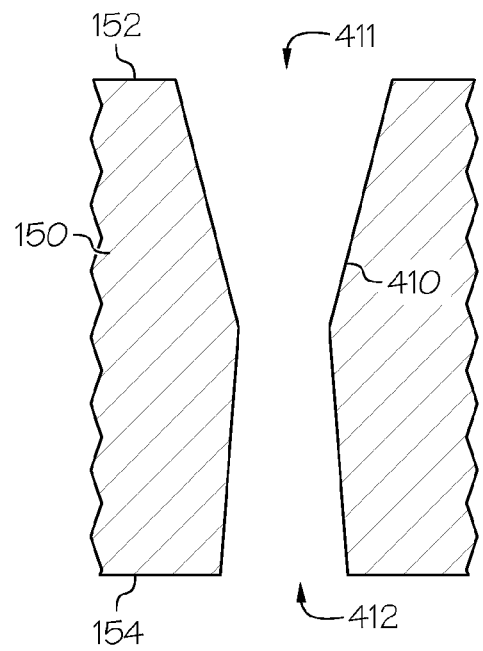
FIG. 4B schematically depicts a cross section of the glass substrate of FIG. 4A after being etched, according to one or more embodiments shown and described herein.

A method for forming a through via in a glass substrate by laser drilling and then ultrasonic-enhanced etching will now be described with reference to FIGS. 4A-4B. Referring now to FIG. 4A, a pilot hole for the through via 410 is laser drilled through the entire thickness of the glass substrate 150. In some embodiment, the pilot hole may be drilled using the system 100 depicted in FIG. 1. The pilot hole for the through via 410 is laser drilled from an incident surface 152 of the glass substrate 150, through the thickness of the glass substrate 150, to an exit surface 154 of the glass substrate 150. The pilot hole extends through the glass substrate 150 from an incident opening 411 of the incident surface 152 to an exit opening 412 of the exit surface 154. A diameter of the incident opening 411 is typically larger than the diameter of the exit opening 412.

Once the pilot hole for the through via 410 is drilled, the glass substrate 150 is submerged in the etching solution 235 of the etching solution tank 230, as depicted in FIG. 2.

Ultrasonic energy is applied by the ultrasonic transducers 250 while the glass substrate 150 is being etched. The glass substrate 150 is etched with the etching solution 235 for an etching duration to increase a diameter of the through via 410, as depicted in FIG. 4B. In some embodiments, the glass substrate 150 is mechanically agitated, such as by moving the glass substrate 150 up and down or side to side in the etching solution 235 either manually or by machine, during at least a portion of the etching duration to facilitate removal of sludge from the via.

In some embodiments, the ultrasonic energy applied to the glass substrate 150 during at least a portion of the etching duration described above with reference to FIGS. 3A-3B and 4A-4B has a frequency between 40 kHz and 192 kHz. Application of an ultrasonic frequency in the 40 kHz to 192 kHz range during etching facilitates the etching and dissolving of glass from the walls of the pilot hole, thereby increasing the diameter of the incident opening 311 of the blind via 310 to a desired diameter. The 40 kHz to 192 kHz range of ultrasonic frequency may minimize surface damage to the glass substrate 150, which may occur at lower frequencies of ultrasonic energy. Furthermore, the 40 kHz to 192 kHz range of ultrasonic frequency may enable effective etching of the via at an acceptable and relatively constant etch rate.

In some embodiments, the ultrasonic energy applied to the glass substrate during at least a portion of the etching duration has a frequency between 80 kHz and 132 kHz. Application of an ultrasonic frequency in the 80 kHz to 132 kHz range during etching facilitates the etching and dissolving of glass from the walls of the pilot hole, thereby increasing the diameter of the incident opening 311 of the blind via 310 and to a desired diameter. The 80 kHz to 132 kHz range of ultrasonic frequency minimizes surface damage to the glass substrate 150, which may occur at frequencies below 80 kHz. Furthermore, the 80 kHz to 132 kHz range of ultrasonic frequency enables effective etching of the via at an acceptable and relatively constant etch rate. The 80 kHz to 132 kHz range may be more preferable than the broader 40 kHz to 192 kHz range because this range is high enough to prevent surface damage, but low enough to ensure effective etching. However, it should be understood that in other embodiments, the ultrasonic frequency range may be other than 40 kHz to 192 kHz or 80 kHz to 132 kHz.

As noted above with respect to FIG. 2, in some embodiments, the ultrasonic energy has a first frequency and a second frequency, such as when the ultrasonic transducers 250 produce ultrasonic energy having at least two frequencies. In some embodiments, the ultrasonic transducers 250 may produce the ultrasonic energy in a "40 kHz/80 kHz cross-fired" configuration in which the first frequency is 40 kHz and the second frequency is 80 kHz. In some embodiments, the ultrasonic transducers 250 may produce the ultrasonic energy in a "80 kHz/120 kHz cross-fired" configuration in which the first frequency is 80 kHz and the second frequency is 120 kHz. In some embodiments, ultrasonic transducers 250 may produce ultrasonic energy that is centered about a primary frequency and dithered or swept above and below the primary frequency, as described above.

Figure 5A:
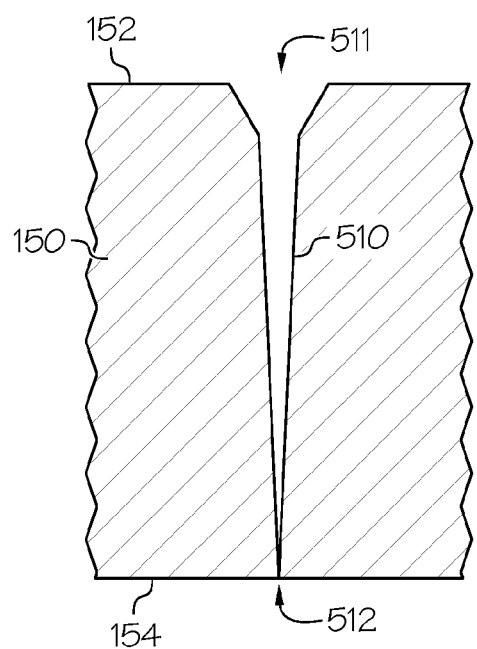
FIG. 5A schematically depicts a cross section of a glass substrate with a through via pilot hole, according to one or more embodiments shown and described herein.

A method for forming a through via in a glass substrate that includes applying and removing an acid-resistant film will now be described with reference to FIGS. 5A-5E. Referring now to FIG. 5A, a pilot hole for the through via 510 is laser drilled through the entire thickness of the glass substrate 150. In some embodiments, the pilot hole may be drilled using the system 100 depicted in FIG. 1. The pilot hole for the through via 510 is laser drilled from an incident surface 152 of the glass substrate 150, through the thickness of the glass substrate 150, to an exit surface 154 of the glass substrate 150. The pilot hole extends through the glass substrate 150 from an incident opening 511 of the incident surface 152 to an exit opening 512 of the exit surface 154. A diameter of the incident opening 511 is typically larger than the diameter of the exit opening 512. If the pilot hole for the through via 510 were etched to open up the through via 510, as described above with reference to FIG. 3B, the diameter of the exit opening 512 would still be smaller than the diameter of the incident opening 511, as depicted in FIG. 3B. Such a mismatch in entry opening diameter and exit opening diameter may result in process issues downstream, which may result in increased processing time and cost. In order to produce through vias that have matching entry opening diameters and exit opening diameters, the processing steps depicted and described below with reference to FIGS. 5B-5E may be employed.

Figure 5B:
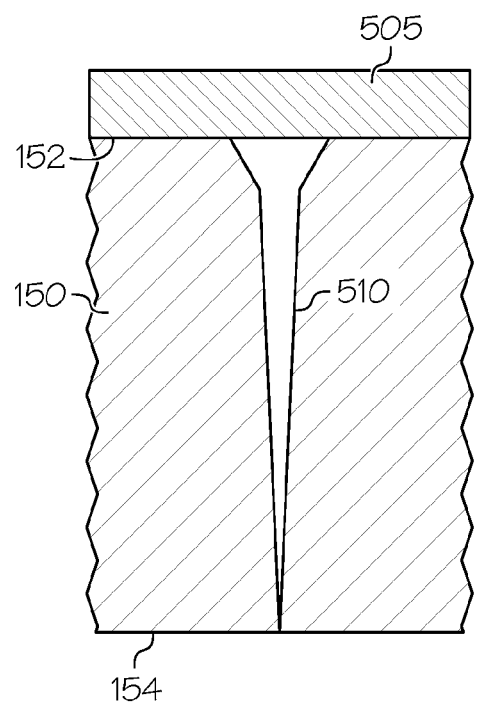
FIG. 5B schematically depicts a cross section of the glass substrate of FIG. 5A after applying an acid-resistant film to an incident surface of the glass substrate, according to one or more embodiments shown and described herein.

Referring now to FIG. 5B, an acid-resistant film 505 may then be applied to the incident surface 152 of the glass substrate 150 to cover the incident opening 511 of the through via 510. It should be understood that the thickness of the acid-resistant film 505 illustrated in FIG. 5B is for illustrative purposes only and the figure is not drawn to scale. In some embodiments, the acid-resistant film 505 is a polymer-based film. The acid-resistant film 505 may be applied to the incident surface 152 by lamination. In some embodiments, the acid-resistant film 505 may be an adhesive acid-resistant film, such as a tape, that may be applied to the surfaces of the glass substrate 150. Such an adhesive acid-resistant film may be applied to the surfaces of the glass substrate 150 manually or by an automated process. In some embodiments, the acid-resistant film 505 may be a photo-resist polymer film that is coated on the incident surface 152 and then cured.

Figure 5C:
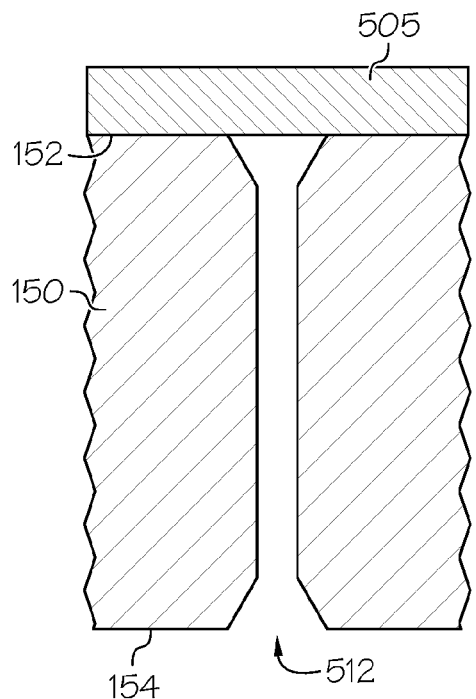
FIG. 5C schematically depicts a cross section of the glass substrate of FIG. 5B after being etched, according to one or more embodiments shown and described herein.

After the acid-resistant film 505 is applied to the incident surface 152 to cover the incident opening 511, the glass substrate 150 is submerged in the etching solution 235 of the etching solution tank 230, as depicted in FIG. 2, for a first etching duration to increase the diameter of the exit opening 512 of the through via 510. The acid-resistant film 505 should resist the etching solution 235 during the first etching duration, diminishing the rate of increase of the diameter of the incident opening 511. In some embodiments, the incident diameter of the incident opening 511 is substantially equal to the exit diameter of the exit opening 512 after the glass substrate 150 is etched for the first etching duration. Such a match in incident diameter and exit diameter avoids the above-noted problems that may arise from mismatched entry and exit diameters. The first etching duration may be chosen such that the incident diameter of the incident opening 511 is substantially equal to the exit diameter of the exit opening 512 after the glass substrate 150 is etched for the first etching duration. In some embodiments, ultrasonic energy is applied by the ultrasonic transducers 250 while the glass substrate 150 is being etched, in any manner described herein. In some embodiments, the glass substrate 150 is mechanically agitated, such as by moving the glass substrate 150 up and down or side to side in the etching solution 235 either manually or by machine, during at least a portion of the etching duration to facilitate removal of sludge from the via. FIG. 5C schematically depicts the glass substrate 150 after this etching step.

Figure 5D:
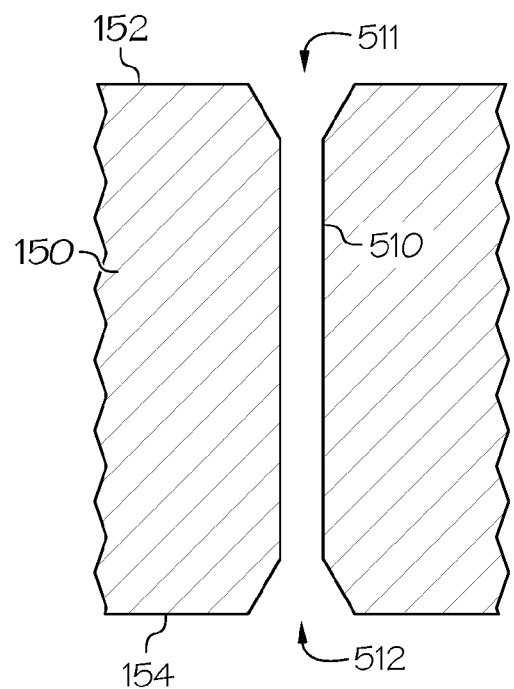
FIG. 5D schematically depicts a cross section of the glass substrate of FIG. 5C after the acid-resistant film is removed, according to one or more embodiments shown and described herein.

Next, the acid-resistant film 505 may be removed from the incident surface 152 of the glass substrate 150, as depicted in FIG. 5D. In some embodiments, the acid-resistant film 505 may be removed by washing the glass substrate 150 with a solvent or soaking the acid-resistant film 505 in hot water and peeling it off of the glass substrate 150.

Figure 5E:
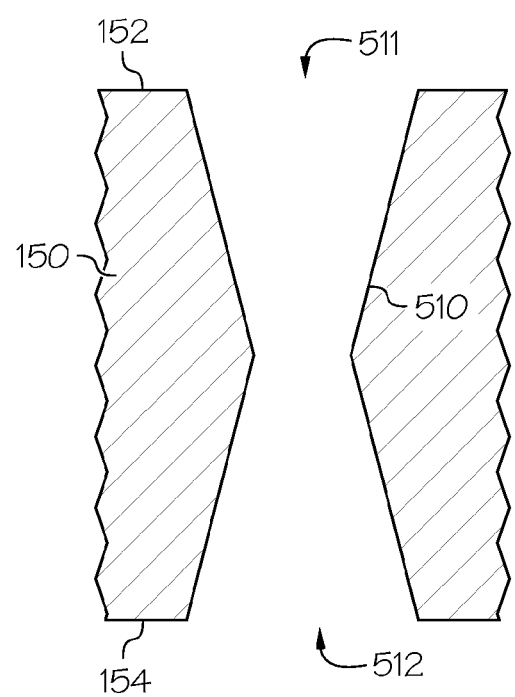
FIG. 5E schematically depicts a cross section of the glass substrate of FIG. 5D after being etched to form a through via, according to one or more embodiments shown and described herein.

After the acid-resistant film 505 is removed from the incident surface 152, the glass substrate 150 is again submerged in the etching solution 235 of the etching solution tank 230, as depicted in FIG. 2, for a second etching duration to increase the diameter of the incident opening 511 and the diameter of the exit opening 512 of the through via 510. In some embodiments, the incident diameter of the incident opening 511 is substantially equal to the exit diameter of the exit opening 512 after the glass substrate 150 is etched for the second etching duration. Such a match in incident diameter and exit diameter avoids the above-noted problems that may arise from mismatched entry and exit diameters. The second etching duration may be chosen such that the incident diameter of the incident opening 511 and the exit diameter of the exit opening 512 reach a desired diameter. In some embodiments, ultrasonic energy is applied by the ultrasonic transducers 250 while the glass substrate 150 is being etched, in any manner described herein. In some embodiments, the glass substrate 150 is mechanically agitated, such as by moving the glass substrate 150 up and down or side to side in the etching solution 235 either manually or by machine, during at least a portion of the etching duration to facilitate removal of sludge from the via. FIG. 5E schematically depicts the glass substrate 150 after this etching step.

Examples Relevant To Via Formation With Ultrasonic Agitation During Etching

The following examples describe via formation via a wet etch process using different ultrasonic schemes to provide ultrasonic energy during etching. Etching solutions were prepared by making one liter mixtures containing 20% by volume of hydrofluoric acid (HF), 10% by volume of nitric acid ($HNO_3$) and the balance deionized (DI) water. The etching solutions were all prepared in the etching solution tank 230. The samples to be etched were placed in the sample holder 240 and the ultrasonic bath was turned on. The etching solution tank 230 was then positioned in the water tank 220 and the sample holder was lowered into the etching solution tank 230. Then, the glass substrate samples, supported by the sample holder 240, were immersed in the etching solution for a pre-determined etch time. After etching, the sample holder 240 with the samples was removed and placed in a water bath to terminate the etching process.

Example A-1

In this control example, four glass samples were etched without ultrasonic agitation. Four samples of Eagle XG© glass were obtained. Through via pilot holes were drilled through the glass samples using a laser beam. The thicknesses of the samples were first measured and recorded. The samples were etched in a one liter solution of HF and $HNO_3$ using mechanical agitation but no ultrasonic application for a specified amount of time. The etch solution temperature was about 25±2° C. After thoroughly washing and drying the samples, the post etch thicknesses of the samples were measured again. To determine the hole quality and shape, the diameters of the holes on the incident surface (also referred to as entry holes), their waist diameters (e.g., the diameter halfway between the incident surface and exit surface), and the exit surface diameters were measured. Table 1, below, shows average diameter and average circularity for entry holes, exit holes, and waists for the vias of each of the four samples. As can be seen from Table 1, the waist/entry and waist/exit aspect ratios were below 0.3, which may be unacceptable for many applications.

TABLE 1

Measurements for Example A-1

|  | Sample 1 | Sample 2 | Sample 3 | Sample 4 |
| --- | --- | --- | --- | --- |
| ENTRY HOLE |  |  |  |  |
| Average Diameter, [μm] | 51.63 | 51.96 | 51.13 | 51.54 |
| Average Circularity, [μm] | 8.28 | 8.99 | 7.46 | 8.24 |
| EXIT HOLE |  |  |  |  |
| Average Diameter, [μm] | 40.64 | 48.53 | 47.91 | 58.49 |
| Average Circularity, [μm] | 0.91 | 0.96 | 0.84 | 1.00 |
| WAIST |  |  |  |  |
| Average Diameter, [μm] | 8.42 | 9.13 | 8.62 | 14.54 |
| Average Circularity, [μm] | 0.52 | 0.75 | 0.53 | 1.79 |
| ASPECT RATIOS |  |  |  |  |
| Exit/Entry | 0.79 | 0.93 | 0.94 | 1.13 |
| Waist/Entry | 0.16 | 0.18 | 0.17 | 0.28 |
| Waist/Exit | 0.21 | 0.19 | 0.18 | 0.25 |

Example A-2

At least two samples of Eagle XG© glass were obtained. Through via pilot holes were drilled through the glass samples using a laser beam. After obtaining the thicknesses of the samples, they were etched in a one liter solution of HF and $HNO_3$ in the presence of a 40 kHz ultrasonic field. The samples were also mechanically agitated. The initial etch solution temperature was about 25±2° C. After thoroughly washing and drying the samples, the post etch thicknesses of the samples were measured again. To determine the hole quality and shape, the diameters of the holes on the incident surface, their waist diameters, and the exit surface diameters were measured. The "40 kHz" column of Table 2, below, shows the measurements and evaluations (e.g., number of chipped entry holes, number of through holes that extended through the glass sample, etc.) for this example.

Example A-3

At least two samples of Eagle XG© glass were obtained. Through via pilot holes were drilled through the glass samples using a laser beam. After obtaining the thicknesses of the samples, they were etched in a one liter solution of HF and $HNO_3$ in the presence of a 132 kHz ultrasonic field. The samples were also mechanically agitated. The initial etch solution temperature was about 25±2° C. After thoroughly washing and drying the samples, the post etch thicknesses of the samples were measured again. To determine the hole quality and shape, the diameters of the holes on the incident surface, their waist diameters, and the exit surface diameters were measured. The "132 kHz" column of Table 2, below, shows the measurements and evaluations (e.g., number of chipped entry holes, number of through holes that extended through the glass sample, etc.) for this example.

Example A-4

At least two samples of Eagle XG© glass were obtained. Through via pilot holes were drilled through the glass samples using a laser beam. After obtaining the thicknesses of the samples, they were etched in a one liter solution of HF and $HNO_3$ in the presence of a 192 kHz ultrasonic field. The samples were also mechanically agitated. The initial etch solution temperature was about 25±2° C. After thoroughly washing and drying the samples, the post etch thicknesses of the samples were measured again. To determine the hole quality and shape, the diameters of the holes on the incident surface, their waist diameters, and the exit surface diameters were measured. The "192 kHz" column of Table 2, below, shows the measurements and evaluations (e.g., number of chipped entry holes, number of through holes that extended through the glass sample, etc.) for this example.

Example A-5

At least two samples of Eagle XG© glass were obtained. Through via pilot holes were drilled through the glass samples using a laser beam. After obtaining the thicknesses of the samples, they were etched in a one liter solution of HF and $HNO_3$ in the presence of a 40/80 kHz dual frequency ultrasonic field. The samples were also mechanically agitated. The initial etch solution temperature was about 25±2° C. After thoroughly washing and drying the samples, the post etch thicknesses of the samples were measured again. To determine the hole quality and shape, the diameters of the holes on the incident surface, their waist diameters, and the exit surface diameters were measured. The "40/80 kHz" column of Table 2, below, shows the measurements and evaluations (e.g., number of chipped entry holes, number of through holes that extended through the glass sample, etc.) for this example.

TABLE 2

Measurements For Examples A-2 through A-5

|  | 40 kHz | 40/80 kHz | 132 kHz | 192 kHz |
|---|---|---|---|---|
| AVE Entry DIA [μm] | 54.25 | 51.62 | 53.25 | 44.74 |
| AVE Waist DIA [μm] | 43.12 | 37.82 | 40.83 | 26.04 |
| AVE Exit DIA [μm] | 45.01 | 42.40 | 43.71 | 36.98 |
| CIRC Entry Holes [μm] | 1.78 | 1.45 | 1.80 | 1.63 |
| CIRC Exit Holes [μm] | 1.12 | 1.06 | 1.11 | 1.04 |
| Chipped Entry Holes | 9 | 11 | 5 | 6 |
| # Through-Holes | 100 | 100 | 100 | 61 |
| Exit/Entry Diameter | 0.83 | 0.82 | 0.82 | 0.83 |
| Waist/Entry Diameter | 0.79 | 0.73 | 0.77 | 0.58 |
| Waist to Exit | 0.96 | 0.89 | 0.93 | 0.70 |

Example A-6

Ten samples of Eagle XG© glass were obtained. Through via pilot holes were drilled through the glass samples using a laser beam. After obtaining the thicknesses of the samples, five of the samples were etched in a one liter solution of HF and $HNO_3$ in the presence of a 40/80 kHz dual frequency ultrasonic field. After obtaining the thicknesses of the samples, five of the samples were etched in a one liter solution of HF and $HNO_3$ in the presence of a 80/120 kHz dual frequency ultrasonic field. The samples were also mechanically agitated. The initial etch solution temperature was about 25±2° C. After thoroughly washing and drying the samples, the post etch thicknesses of the samples were measured again. To determine the hole quality and shape, the diameters of the holes on the incident surface, their waist diameters, and the exit surface diameters were measured. Table 3, below, shows the measurements and evaluations (e.g., missing exit holes, etch damage, etc.) for this example. From Table 3, it is apparent that all samples had 100% through vias. The hole diameter and circularity were similar for both the 40/80 kHz samples and the 80/120 kHz samples. However, 4 out of 5 samples etched using the 40/80 kHz ultrasonic energy system exhibited some degree of surface damage. However, the 80/120 kHz ultrasonic energy system did not cause any damage to the samples, while also demonstrating comparable waist-to-entry diameter ratios. From this experiment, it is apparent that ultrasonic frequencies in the range from 80 kHz to 132 kHz or from about 80 kHz to 120 kHz provide effective conditions for forming vias with desirable aspect ratios and minimizing surface damage of the glass substrate.

TABLE 3

Measurements For Example A-6

|  | 40/80 kHz | | | | | 80/120 kHz | | | | |
|---|---|---|---|---|---|---|---|---|---|---|
| Sample | 1 | 2 | 3 | 4 | 5 | 6 | 7 | 8 | 9 | 10 |
| AVE Entry DIA [μm] | 44.90 | 45.33 | 44.60 | 44.64 | 44.67 | 44.14 | 43.46 | 43.37 | 43.97 | 44.30 |
| AVE Waist DIA [μm] | 28.68 | 28.54 | 28.41 | 28.36 | 28.18 | 28.37 | 27.88 | 27.54 | 27.92 | 28.54 |
| AVE Exit DIA [μm] | 34.64 | 36.53 | 36.45 | 36.30 | 36.22 | 36.39 | 35.69 | 35.38 | 35.52 | 36.45 |
| CIRC Entry Holes [μm] | 1.45 | 1.57 | 1.35 | 1.33 | 1.40 | 1.40 | 1.33 | 1.34 | 1.35 | 1.43 |
| CIRC Exit Holes [μm] | 0.68 | 0.76 | 0.81 | 0.73 | 0.70 | 0.75 | 0.59 | 0.57 | 0.53 | 0.63 |
| Exit DIA/Entry DIA | 0.816 | 0.806 | 0.817 | 0.813 | 0.811 | 0.824 | 0.821 | 0.816 | 0.808 | 0.823 |
| Waist DIA/Entry DIA | 0.639 | 0.630 | 0.637 | 0.635 | 0.631 | 0.643 | 0.642 | 0.635 | 0.635 | 0.644 |
| Number of Holes | 100 | 100 | 100 | 100 | 100 | 100 | 100 | 100 | 100 | 100 |
| Missing Exit Holes | 1 | 0 | 1 | 0 | 1 | 1 | 1 | 0 | 0 | 1 |
| Etch Damage | yes | onset | onset | onset | no | no | no | no | no | no |

Example A-7

At least two samples of Eagle XG© glass were obtained. Through via pilot holes were drilled through the glass samples using a laser beam. After obtaining the thicknesses of the samples, they were etched in a one liter solution of HF and $HNO_3$ in the presence of a 80/120 kHz dual frequency ultrasonic field. The samples were not mechanically agitated. The initial etch solution temperature was about $25\pm2°$ C. After thoroughly washing and drying the samples, the post etch thicknesses of the samples were measured again. To determine the hole quality and shape, the diameters of the holes on the incident surface, their waist diameters, and the exit surface diameters were measured. Many of the holes did not open up after etching, indicating that mechanical agitation during etching may be advantageous in some circumstances.

Examples Relevant To Via Formation With Acid-Resistant Film Application And Removal The following examples describe via formation including etching of different samples of glass in which incident hole diameters and exit hole diameters were compared. From these examples, it can be concluded that when performing a first etching step with lamination on the incident surface prior to a second etching step without lamination, identical exit and incident diameters can be achieved. The length of the first etching step can be adjusted to achieve a desired aspect ratio of 1 (i.e., identical entry and exit diameters). Furthermore, by comparing examples B-2 through B-4 (in which ultrasonic agitation was only used during the second etching step) with examples B-6 through B-8 (in which ultrasonic agitation was used during both the first etching step and the second etching step), it can be concluded that the etch rate is increased by applying ultrasonic agitation during both the first etching step and the second etching step.

Example B-1

In this example, a control sample was etched without lamination using ultrasonic agitation. Through via pilot holes were drilled through a sample of glass using a laser beam. The sample was etched for 8 minutes in a one liter solution of HF and HNO3 in the presence of a 40/80 kHz cross-fired ultrasonic field. The solution temperature was about $25\pm2°$ C.

After thoroughly washing and drying the sample, the diameter of the holes on the incident surface and those on the exit surface were measured. The ratio of the exit side diameter to the incident side diameter was calculated as 0.87.

Example B-2

Through via pilot holes were drilled through a sample of glass using a laser beam. The sample was laminated on the incident side of the laser beam using a clear HF-acid-resistant polymer film. The sample was then etched in a one liter solution of HF and $HNO_3$ without any ultrasonic agitation for 4 minutes. The sample was washed and the lamination removed. The sample was etched again in a fresh one liter solution for about 8 minutes, this time, in the presence of a 40/80 kHz cross-fired ultrasonic field. The solution temperature was about $25\pm2°$ C. After thoroughly washing and drying the sample, the diameter of the holes on the incident surface and those on the exit surface were measured. The ratio of the exit side diameter to the incident side diameter was calculated as 0.97.

Example B-3

Through via pilot holes were drilled through a sample of glass using a laser beam. The sample was laminated on the beam incident side using a clear HF acid resistant polymer film. The sample was then etched in a one liter solution of HF and $HNO_3$ without any ultrasonic agitation for 5 minutes. The sample was washed and the lamination removed. The sample was etched again in a fresh one liter solution for about 8 minutes, this time, in the presence of a 40/80 kHz cross-fired ultrasonic field. The solution temperature was about $25\pm2°$ C. After thoroughly washing and drying the sample, the diameter of the holes on the incident surface and those on the exit surface were measured. The ratio of the exit side diameter to the incident side diameter was calculated as 1.03.

Example B-4

Through via pilot holes were drilled through a sample of glass using a laser beam. The sample was laminated on the beam incident side using a clear HF acid resistant polymer film. The sample was then etched in a one liter solution of HF and $HNO_3$ without any ultrasonic agitation for 6 minutes. The sample was washed and the lamination removed. The sample was etched again in a fresh one liter solution for about 8 minutes, this time, in the presence of a 40/80 kHz cross-fired ultrasonic field. The solution temperature was about $25\pm2°$ C. After thoroughly washing and drying the sample, the diameter of the holes on the incident surface and those on the exit surface were measured. The ratio of the exit side diameter to the incident side diameter was calculated as 1.06.

Example B-5

In this example, a control sample was etched without lamination using ultrasonic agitation. Through via pilot holes were drilled through a sample of glass using a laser beam. The sample was etched for 8 minutes in a one liter solution of HF and $HNO_3$ in the presence of a 40/80 kHz cross-fired ultrasonic field. The solution temperature was about $25\pm2°$ C. After thoroughly washing and drying the sample, the diameter of the holes on the incident surface and those on the exit surface were measured. The ratio of the exit side diameter to the incident side diameter was calculated as 0.84.

Example B-6

Through via pilot holes were drilled through a sample of glass using a laser beam. The sample was laminated on the beam incident side using a clear HF acid resistant polymer film. The sample was then etched in a one liter solution of HF and $HNO_3$ for 2 minutes in the presence of a 40/80 kHz cross-fired ultrasonic field. The sample was washed and the lamination removed. The sample was etched in a fresh one liter solution for about 8 minutes again in the presence of a 40/80 kHz cross-fired ultrasonic field. The solution temperature was about $25\pm2°$ C. After thoroughly washing and drying the sample, the diameter of the holes on the incident surface and those on the exit surface were measured. The ratio of the exit side diameter to the incident side diameter was calculated as 0.96.

Example B-7

Through via pilot holes were drilled through a sample of glass using a laser beam. The sample was laminated on the beam incident side using a clear HF acid resistant polymer film. The sample was then etched in a one liter solution of HF and $HNO_3$ for 4 minutes in the presence of a 40/80 kHz cross-fired ultrasonic field. The sample was washed and the lamination removed. The sample was etched again in a fresh one liter solution for about 8 minutes again in the presence of a 40/80 kHz cross-fired ultrasonic field. The solution temperature was about 25±2° C. After thoroughly washing and drying the sample, the diameter of the holes on the incident surface and those on the exit surface were measured. The ratio of the exit side diameter to the incident side diameter was calculated as 1.08.

Example B-8

Through via pilot holes were drilled through a sample of glass using a laser beam. The sample was laminated on the beam incident side using a clear HF acid resistant polymer film. The sample was then etched in a one liter solution of HF and $HNO_3$ for 6 minutes in the presence of a 40/80 kHz cross-fired ultrasonic field. The sample was washed and the lamination removed. The sample was etched again in a fresh one liter solution for about 8 minutes again in the presence of a 40/80 kHz cross-fired ultrasonic field. The solution temperature was about 25±2° C. After thoroughly washing and drying the sample, the diameter of the holes on the incident surface and those on the exit surface were measured. The ratio of the exit side diameter to the incident side diameter was calculated as 1.23.

It should be understood that embodiments described herein provide for forming vias in glass substrates by laser drilling and etching during the application of ultrasonic energy having a frequency between 40 kHz and 192 kHz. By applying ultrasonic energy having a frequency of between 40 kHz and 192 kHz during etching, glass substrates with vias having desired dimensions and properties can be quickly produced while minimizing damage to the glass. Furthermore, embodiments described herein provide for forming through vias by laser drilling, film application, etching, film removal, and etching, which results in vias having comparable incident opening and exit opening dimensions.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A method of forming a via in a glass substrate, the method comprising:
    laser drilling the via through at least a portion of a thickness of the glass substrate, wherein the via is laser drilled through the glass substrate from an incident surface of the glass substrate;
    etching the glass substrate for an etching duration, thereby increasing a diameter of an incident opening of the via; and
    applying ultrasonic energy to the glass substrate during at least a portion of the etching duration, wherein the ultrasonic energy has a first frequency and a second frequency.

2. The method of claim 1, wherein the via is a through via, wherein the through via is drilled from the incident surface to an exit surface of the glass substrate, the through via extending between the incident opening of the incident surface of the glass substrate and an exit opening of the exit surface of the glass substrate.

3. The method of claim 1, wherein the via is a blind via, wherein the blind via is drilled from the incident surface to a depth of the glass substrate, the blind via extending through the glass substrate from the incident opening of the incident surface to the depth of the glass substrate.

4. The method of claim 1, wherein the first frequency of ultrasonic energy is delivered by a first ultrasonic transducer, the second frequency of the ultrasonic energy is delivered by a second ultrasonic transducer, and the first ultrasonic transducer and the second ultrasonic transducer produce the first frequency and the second frequency simultaneously.

5. The method of claim 1, wherein the first frequency is 80 kHz and the second frequency is 120 kHz.

6. The method of claim 1, further comprising mechanically agitating the glass substrate during the etching duration.

7. A method of forming a via in a glass substrate, the method comprising:
    laser drilling the via through at least a portion of a thickness of the glass substrate, wherein the via is laser drilled through the glass substrate from an incident surface of the glass substrate;
    etching the glass substrate for an etching duration, thereby increasing a diameter of an incident opening of the via; and
    applying ultrasonic energy to the glass substrate during at least a portion of the etching duration, wherein the ultrasonic energy is centered about a primary frequency and dithered or swept above and below the primary frequency.

8. The method of claim 7, wherein the via is a through via, wherein the through via is drilled from the incident surface to an exit surface of the glass substrate, the through via extending between the incident opening of the incident surface of the glass substrate and an exit opening of the exit surface of the glass substrate.

9. The method of claim 7, wherein the via is a blind via, wherein the blind via is drilled from the incident surface to a depth of the glass substrate, the blind via extending through the glass substrate from the incident opening of the incident surface to the depth of the glass substrate.

10. The method of claim 7, further comprising mechanically agitating the glass substrate during the etching duration.

* * * * *